(12) United States Patent
Genier et al.

(10) Patent No.: US 7,001,462 B2
(45) Date of Patent: Feb. 21, 2006

(54) METHOD FOR MAKING AN ORIENTED OPTICAL FLUORIDE CRYSTAL BLANK

(75) Inventors: Michael L. Genier, Ware, MA (US); Richard S. Priestley, Painted Post, NY (US); Rebecca S. Retherford, Campbell, NY (US)

(73) Assignee: Corning Incorporated, Corning, NY (US)

(*) Notice: Subject to any disclaimer, the term of this patent is extended or adjusted under 35 U.S.C. 154(b) by 107 days.

(21) Appl. No.: 10/382,767

(22) Filed: Mar. 5, 2003

(65) Prior Publication Data

US 2003/0209190 A1 Nov. 13, 2003

Related U.S. Application Data

(60) Provisional application No. 60/362,054, filed on Mar. 5, 2002.

(51) Int. Cl.
*C30B 1/03* (2006.01)

(52) U.S. Cl. .................. 117/201; 117/202; 117/223; 117/2; 117/81; 117/82; 117/83

(58) Field of Classification Search ............ 117/2, 117/81, 82, 83, 201, 202, 223
See application file for complete search history.

(56) References Cited

U.S. PATENT DOCUMENTS

| | | | | |
|---|---|---|---|---|
| 5,379,311 A | * | 1/1995 | McFarlane et al. | ............ 372/41 |
| 6,411,384 B1 | | 6/2002 | Sakuma et al. | ............. 356/365 |
| 6,683,714 B1 | * | 1/2004 | Meda et al. | ................ 359/355 |
| 6,782,074 B1 | * | 8/2004 | Sakuma | ....................... 378/70 |
| 6,782,075 B1 | * | 8/2004 | Pell | ............................. 378/73 |
| 6,788,389 B1 | * | 9/2004 | Fujishima et al. | ............ 355/67 |
| 2002/0020338 A1 | | 2/2002 | Oba et al. | ..................... 117/13 |

FOREIGN PATENT DOCUMENTS

| | | |
|---|---|---|
| EP | 0610563 A2 | 11/1993 |
| EP | 0942297 A2 | 9/1999 |
| EP | 0450579 A2 | 10/2001 |
| JP | 11037958 | 2/1999 |
| WO | WO00/75405 A2 | 12/2000 |
| WO | WO01/01182 | 1/2001 |

OTHER PUBLICATIONS

The Laue Method, pp. 4 and 5 updated Jul. 25, 2000, The University of Liverpool, http://www.matter.org.uk/diffraction/x-ray/laue_method.htm.*

* cited by examiner

*Primary Examiner*—Robert Kunemund
(74) *Attorney, Agent, or Firm*—Walter M. Douglas (57) ABSTRACT

A method of making an oriented fluoride crystal blank for transmitting below 250 nm ultraviolet light includes irradiating a fluoride crystal blank with an x-ray beam, detecting the x-ray beams diffracted from the fluoride crystal blank, generating a diffraction pattern from the x-ray beam diffracted from the fluoride crystal blank, determining an angular deviation of an optical axis of the fluoride crystal blank from a specific crystallographic direction, and, if the angular deviation is not within a predefined range, modifying the fluoride crystal blank in a manner such that that the resultant angular deviation between the optical axis of the fluoride crystal blank from the specific crystallographic direction after modifying falls within the predefined range.

9 Claims, 13 Drawing Sheets

METHOD FOR MAKING AN ORIENTED OPTICAL FLUORIDE CRYSTAL BLANK

CROSS-REFERENCE TO RELATED APPLICATIONS

This application claims priority from U.S. Provisional Application No. 60/362,054, filed Mar. 5, 2002, in the names of Richard S. Priestley and Rebecca S. Retherford, entitled "X-ray Measurement of Optical Fluoride Crystals."

BACKGROUND OF INVENTION

1. Field of the Invention

The invention relates generally to a method of making optical fluoride crystal elements. More specifically, the invention relates to a method of making an optical fluoride crystal blank that has its optical axis oriented along a specific crystallographic direction.

2. Background Art

Optical lithography systems are used in the manufacture of integrated circuits to print circuit patterns on a silicon surface. The optical lithography systems contain an illumination system and a projection system. The illumination system is used to irradiate a mask having a circuit pattern thereon, and the projection system is used to focus the pattern on the mask onto a silicon surface coated with a photoresist, thereby transferring the pattern on the mask onto the silicon surface.

The smallest feature size that can be printed is described by the following expression:

$$\text{Feature size} = \frac{k_1 \lambda}{NA}$$

where $k_1$ is a proportionality constant that depends on the photoresist, specific illumination characteristics, mask geometry, and manufacturing process, $\lambda$ is the illumination wavelength, NA is the numerical aperture of the objective. In general, the shorter the illumination wavelength, the smaller the feature size can be.

Many of the optical lithography systems currently on the market use ultraviolet light having a wavelength of 248 nm to print features as small as 0.25 $\mu$m. To obtain circuit features smaller than 0.25 $\mu$m, optical lithography systems using wavelengths shorter than 248 nm are needed. Optical lithography systems using 193 nm wavelength have been developed. Optical lithography systems using 157 nm wavelength are under active development. The 157-nm system is expected to print features as small as 100 nm.

Generally speaking, commercial use and adoption of the shorter-wavelength systems in high volume production of integrated circuits has been slow. This slow progression can be partly attributed to the stringent demands placed on the optical materials used in the projection system. The optical materials are required to have high transmittance properties at the illumination wavelength. The optical materials are required to be resistant to laser damage. The optical materials are required to have low residual index inhomogeneity, anisotropy, and birefringence.

The current trend in the industry is to use single grained fluoride crystals, for example calcium fluoride, barium fluoride, magnesium fluoride, and strontium fluoride crystals, to transmit wavelengths shorter than 200 nm. However, making fluoride crystal optical elements that meet the stringent demands required by the 193-nm and 157-nm lithography systems has been challenging. In particular, it is difficult to grow fluoride crystals that meet the low birefringence required in these systems. For instance, the target birefringence for fluoride crystals used in the 157-nm lithography system is less than 1 nm/cm.

Two types of birefringence phenomena are observed in fluoride crystals: stress-induced birefringence and intrinsic birefringence. Stress-induced birefringence is a consequence of the crystal growth process and can be reduced by improvement in the growth process. Intrinsic birefringence, on the other hand, has nothing to do with stress and cannot be reduced by improvement in the growth process. See, for example, Burnett, John H. et al, "Intrinsic Birefringence in Crystalline Optical Materials: A New Concern for Lithography," Future FAB International Issue 12.

Burnett et al., supra, show that intrinsic birefringence has specific orientations with respect to the crystallographic directions. There are 12 birefringent maxima in the equivalent [110] directions, 6 birefringent zeros along the equivalent [100] directions, and 8 birefringent zeros along the equivalent [111] directions. This means that the optical axis of the crystal can be aligned with a specific crystallographic direction where intrinsic birefringence is zero or small. Also, multiple crystals elements having their optical axes aligned with specific crystallographic directions can be coupled together such that the net birefringence of the crystals is reduced in comparison to using only a single crystal orientation with the same focusing power.

It is important to verify that the optical axis of the crystal does not deviate from the desired crystallographic direction by more than a specified value. For example, for a [111] oriented calcium fluoride crystal, the maximum angular deviation that can be tolerated is ±5°. This is because birefringence increases rapidly for angles away from the [111] direction. Therefore, the smaller the angular deviation of the optical axis of the crystal from the [111] direction, the better the performance of the crystal will be when used in the lithography system. In general, the maximum angular deviation that can be tolerated will depend on the desired orientation of the optical axis.

BRIEF SUMMARY OF INVENTION

In one aspect, the invention relates to a method of making an oriented fluoride crystal blank for transmitting below 250 nm UV light which comprises irradiating a fluoride crystal blank with an x-ray beam, detecting x-ray beams diffracted from the fluoride crystal blank, generating a diffraction pattern from the x-ray beam diffracted from the fluoride crystal blank, determining an angular deviation of an optical axis of the fluoride crystal blank from a specific crystallographic direction, and, if the angular deviation is not within a predefined range, modifying the fluoride crystal blank in a manner such that the resultant angular deviation of the optical axis of the fluoride crystal blank from the specific crystallographic direction after modifying falls within the predefined range.

In another aspect, the invention relates to an apparatus for making an oriented fluoride crystal blank for transmitting below 250 nm ultraviolet light which comprises a Laue system. The Laue system comprises a sample holder for holding the fluoride crystal blank, an x-ray generator for generating an x-ray beam to strike the fluoride crystal blank at normal incidence, and an x-ray detector for detecting x-ray beams diffracted from the fluoride crystal blank. The apparatus further includes a machining tool for forming a flat surface on the fluoride crystal blank based on orientation information deduced from the diffracted x-ray beams and means for translating the sample holder between the Laue system and the machining tool.

Other features and advantages of the invention will be apparent from the following description and the appended claims.

DETAILED DESCRIPTION

The invention will now be described in detail with reference to a few preferred embodiments, as illustrated in accompanying drawings. In the following description, numerous specific details are set forth in order to provide a thorough understanding of the invention. It will be apparent, however, to one skilled in the art, that the invention may be practiced without some or all of these specific details. In other instances, well-known features and/or process steps have not been described in detail in order to not unnecessarily obscure the invention. The features and advantages of the invention may be better understood with reference to the drawings and discussions that follow.

Embodiments of the invention provide a method of making an oriented optical fluoride crystal blank. The fluoride crystals of interest in the invention are those that can be used in optical lithography projection systems, such as 193-nm and 157-nm lithography systems. For example, the fluoride crystals could be single grained crystals of NaF, KF, LiF, $CaF_2$, $BaF_2$, $MgF_2$, or $SrF_2$, or single grained crystals of mixed fluorides, such as $(M1)_x(M2)_{1-x}F_2$, where M1 can be selected from Ba, Ca, or Sr and $0 \leq x \leq 1$, or even combinations of formulation $Ca_{1-x-y}Ba_xSr_yF_2$, where $0 \leq x \leq 1$ and $0 \leq y \leq 1$, or even combinations of formulation $MRF_3$, where M can be selected from Li, Na, or K, and R can be selected from Ca, Sr, Ba, or Mg.

The method of the invention starts with the growing of a fluoride crystal ingot. A single fluoride crystal ingot can be grown using the Bridgman-Stockbarger technique or other suitable crystal growth technique, for example the gradient freeze or traveling heater technique. After growing the fluoride crystal ingot, a fluoride crystal blank is cut from the fluoride crystal ingot. Then, the orientation of the optical axis of the fluoride crystal blank with respect to a desired crystallographic direction is determined. The desired crystallographic direction could be one in which birefringence is zero or small (e.g., less than 3 nm/cm), e.g., the [100], [010], [001], or [111] direction. If the optical axis does not coincide with the desired crystallographic direction, the amount of deviation from the desired crystallographic direction is determined. This information is then used to cut through the fluoride crystal blank such that the optical axis of the fluoride crystal blank coincides with the desired crystallographic orientation.

Figure 1A:
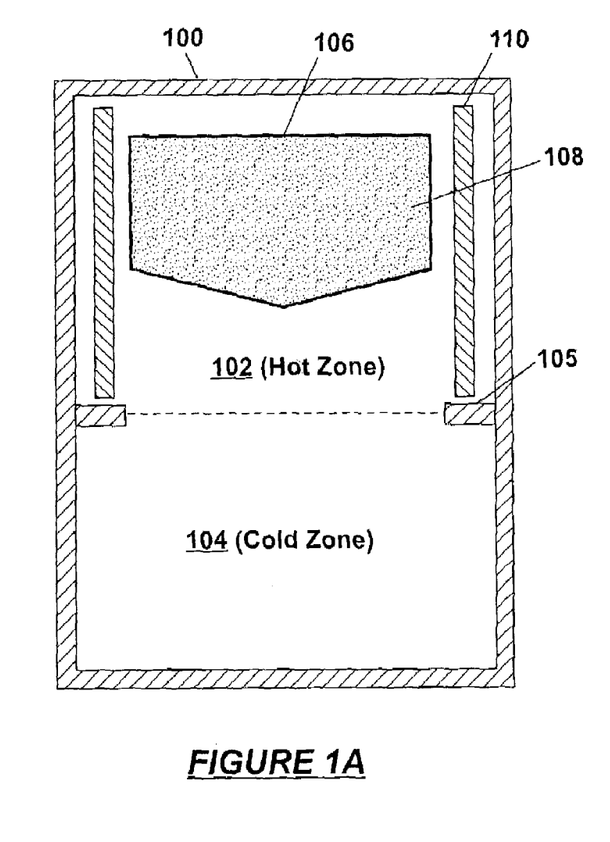
FIGS. 1A–1C illustrate a Bridgman-Stockbarger process for growing a fluoride crystal.
Figure 1B:
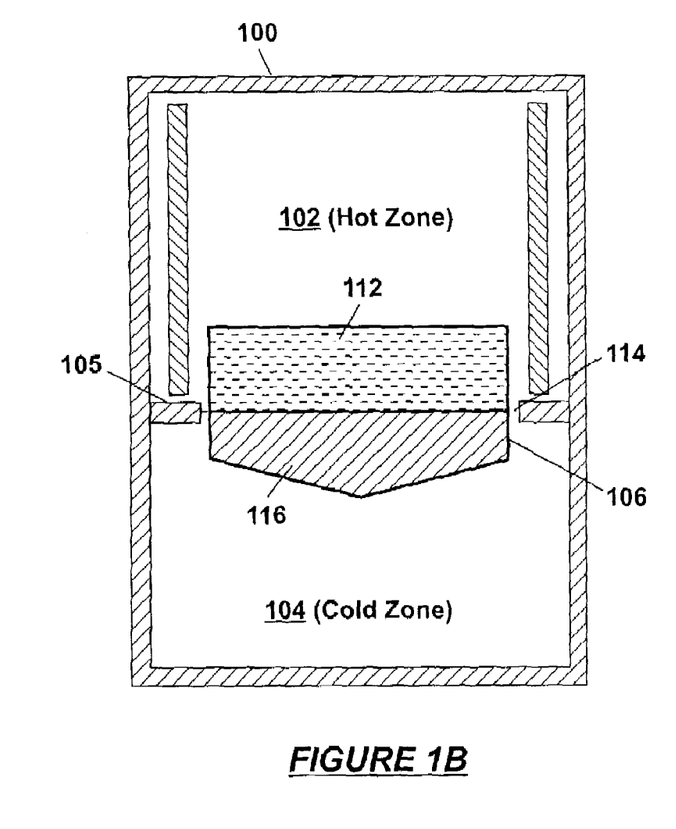

For illustration purposes, a Bridgman-Stockbarger technique for growing a fluoride crystal will now be described with reference to FIGS. 1A and 1B. FIG. 1A shows a vertical furnace 100 having a hot zone 102 and a cold zone 104. Typically, an insulating barrier 105 separates the hot zone 102 from the cold zone 104. A crucible 106 containing a fluoride raw material 108 is disposed inside the hot zone 102 of the furnace 100. Preferably, the fluoride raw material 108 is substantially free of oxide impurities and/or the fluoride raw material 108 is exposed to an oxide scavenger during the crystal growth process. During the crystal growth process, vacuum or an inert atmosphere may be maintained inside the furnace 100 to prevent oxidation of the fluoride raw material 108 and components of the furnace 100.

In the hot zone 102, a heater 110 is used to heat the crucible 106 to a temperature sufficient to melt the fluoride raw material 108. The heater 110 could be a single circumferential heater or multiple heating elements. After melting the fluoride raw material 108, the crucible 106 is slowly lowered from the hot zone 102, through the insulating barrier 105, into the cold zone 104, as shown in FIG. 1B. The cold zone 104 is at a temperature lower than the melting point of the fluoride raw material 108. As the crucible 106 passes from the hot zone 102 to the cold zone 104, the molten material 112 goes through a thermal gradient zone 114 (created by a difference in temperature between the hot zone 102 and cold zone 104). On passing through the thermal gradient zone 114, the temperature transition inside the molten material 112 creates a crystal front 116. The crystal front 116 propagates inside the crucible 106, within the molten material 112, as long as the crucible 106 is caused to move downwardly.

Figure 1C:
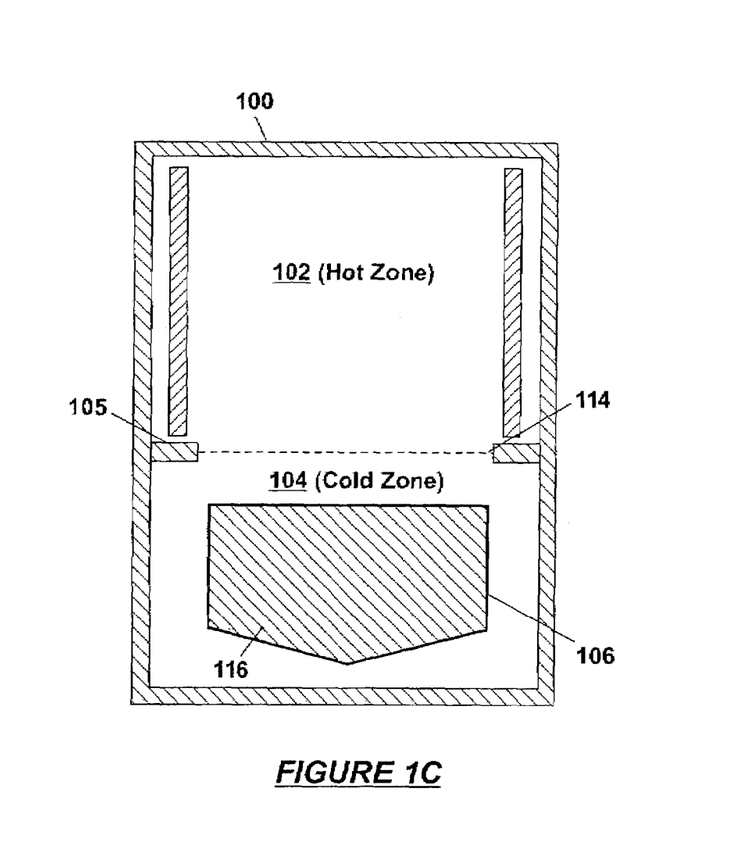

FIG. 1C shows the crucible 106 fully inside the cold zone 104, where the fluoride crystal 116 is now allowed to cool down to room temperature. One or more heaters (not shown) and/or insulation may be provided in the cold zone 104 to allow for better control of the cooling rate of the fluoride crystal 116 such that the birefringence value of the fluoride crystal 116 is within acceptable limit, e.g., less than 3 nm/cm, preferably less than 1 nm/cm. After the fluoride crystal 116 cools down, its birefringence value can be determined. If the birefringence value of the fluoride crystal 116 exceeds the acceptable limit, the fluoride crystal 116 may be annealed to reduce the birefringence to an acceptable value. Typically, the annealing process involves re-heating the fluoride crystal 116, holding the fluoride crystal 116 at this temperature until the thermal stresses induced in the fluoride crystal 116 dissipate, and then slowly cooling the fluoride crystal 116 to a temperature below which any stress due to additional cooling to room temperature will result in only temporary strain in the fluoride crystal 116.

Figure 2:
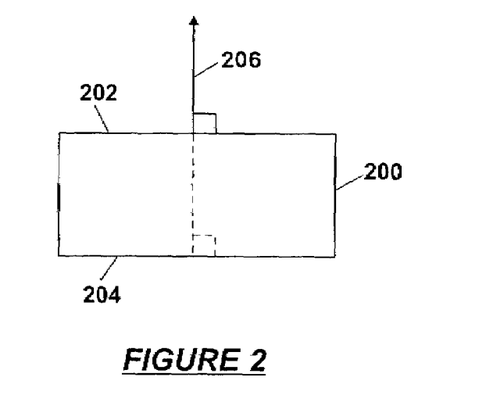
FIG. 2 shows an optical fluoride crystal blank formed from a fluoride crystal grown by the process described in FIGS. 1A–1C.

FIG. 2 shows an optical fluoride crystal blank 200 formed from a fluoride crystal ingot, such as the fluoride crystal 116 in FIG. 1C. The optical fluoride crystal blank 200 has two (substantially) parallel crystal planes 202, 204 for transmitting light. The optical axis 206 of the fluoride crystal blank 200 is normal to the light-transmitting planes 202, 204. The optical axis 206 may be oriented along a specific crystallographic direction. For example, to minimize intrinsic birefringence, the optical axis 206 may be oriented along any one of the equivalent [100] or [111] directions where intrinsic birefringence is zero, e.g., along [100], [010], [001], or [111] direction. As will be further described below, the orientation of the optical axis 206 can be determined from a Laue (or diffraction) pattern of the fluoride crystal blank 200.

Figure 3A:
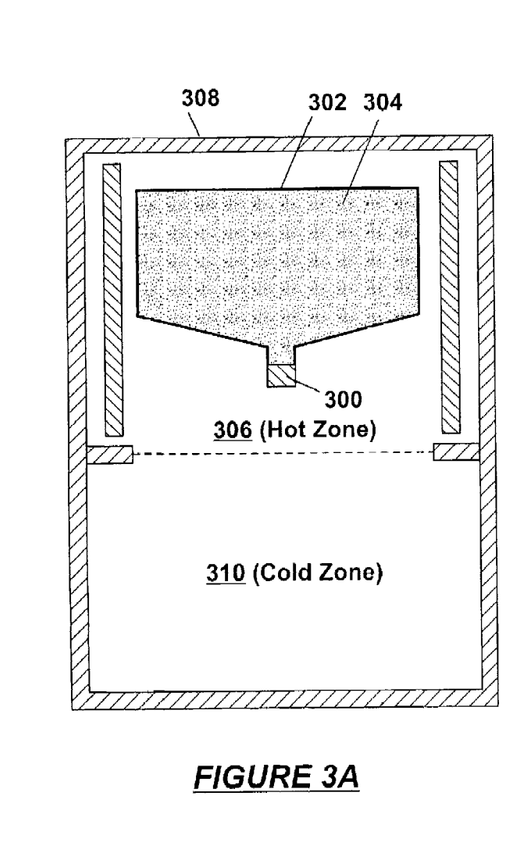
FIGS. 3A and 3B illustrate a crystal growth process using a seed crystal.
Figure 3B:
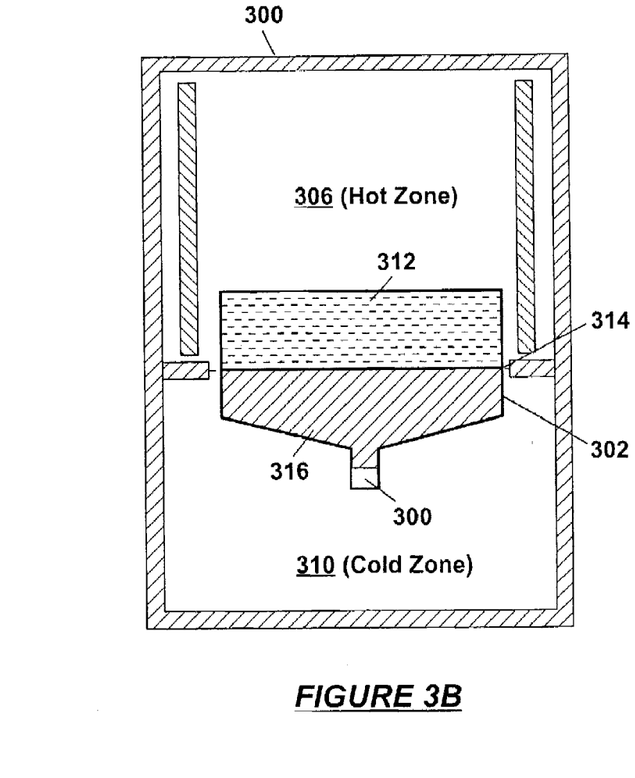

In the method described above, the fluoride crystal is not grown to have a specific crystallographic orientation. A fluoride crystal can be grown to have a specific crystallographic orientation using a seed crystal that has the specific crystallographic orientation. A process for growing a fluoride crystal using a seed crystal is illustrated in FIGS. 3A and 3B. FIG. 3A shows a seed crystal 300 having the desired crystallographic orientation at a base of the crucible 302. A fluoride raw material 304 is placed in the crucible 302, on top of the seed crystal 300. The crucible 302 is disposed in a hot zone 306 of a vertical furnace 308. The rest of the crystal growth process continues as previously described. That is, the fluoride raw material 304 is melted inside the crucible 302 in the hot zone 306. Then, the crucible 302 is translated from the hot zone 306 to a cold zone 310 in the furnace 308, as shown in FIG. 3B.

As the crucible 302 passes from the hot zone 306 to the cold zone 310, the molten material, indicated at 312, goes through a zone of thermal gradient 314, creating a crystal front 316 inside the crucible 302. The crystal front 316 propagates inside the crucible 302 as the crucible 302 moves downwardly. The crystal front 316 conforms to the crystallographic orientation of the seed crystal 300 as it propagates inside the crucible 302. After growing the crystal 316 and cooling the crystal 316 to room temperature, an optical fluoride crystal blank may be formed from the crystal 316 as previously described. If the birefringence value of the crystal 316 is higher than an acceptable limit, the crystal 316 may be subjected to annealing prior to being shaped into an optical fluoride crystal blank.

Figure 4:
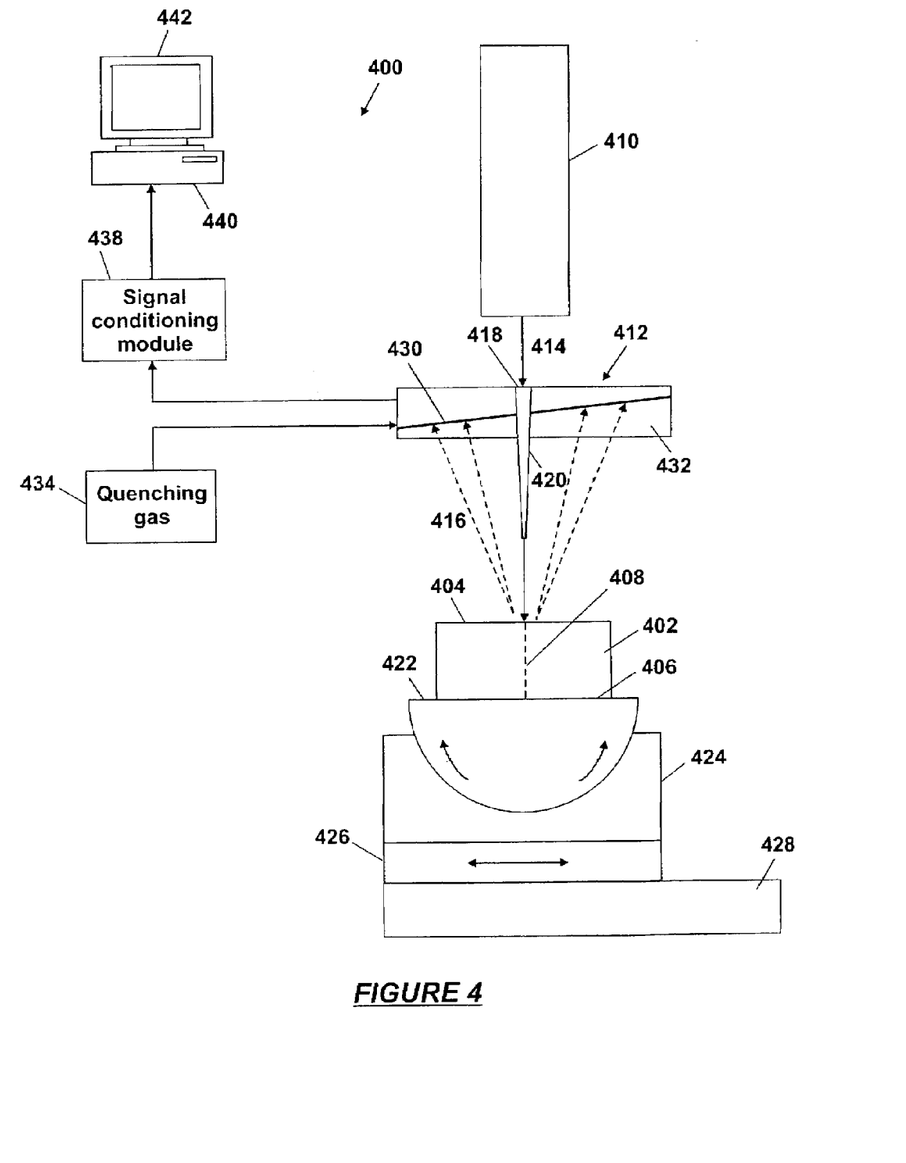
FIG. 4 shows a schematic of a Laue system for obtaining a Laue pattern of a fluoride crystal blank according to an embodiment of the invention.

FIG. 4 shows a schematic of a system 400 for obtaining a Laue (or diffraction) pattern of a sample crystal, such as an optical fluoride crystal blank 402. The fluoride crystal blank 402 has parallel crystal planes 404, 406 for transmitting light. The optical axis 408 of the fluoride crystal blank 402 is normal to the crystal planes 404, 406. The fluoride crystal blank 402 could be any single optical fluoride crystal, such as previously described. The dimensions of the fluoride crystal blank 402 would depend on the target application. The fluoride crystal blank 402 may be obtained from a crystal ingot grown by the Bridgman-Stockbarger technique or other crystal growth process capable of making a high-quality fluoride crystal. The fluoride crystal blank 402 may or may not have been formed from a crystal grown to have a specific crystallographic orientation.

The system 400 includes an x-ray generator 410 and an x-ray detector 412. In operation, the x-ray generator 410 generates an x-ray beam 414, which is used to irradiate the fluoride crystal blank 402, and the x-ray detector 412 senses beams 416 diffracted from the planes of the fluoride crystal blank 402. The x-ray detector 412 includes a hole 418 through which the x-ray beam 414 can be transmitted from the x-ray generator 410 to the fluoride crystal blank. In one embodiment, a collimator tube 420 is mounted in the hole 418 to collimate the x-ray beam 414 prior to the x-ray beam 414 striking the fluoride crystal blank 402. The fluoride crystal blank 402 is mounted on a sample holder 422, which is mounted on a tilt platform 424, which is mounted on an x-y translation stage 426, which is mounted on a rotary table 428. The tilt platform 424, the x-y translation stage 426, and the rotary table 428 provide the capability to place the fluoride crystal blank 402 in a desired orientation with respect to the x-ray detector 412 and the x-ray generator 410.

The Laue system 400 may be operated in a back-reflection or transmission mode. Whether the Laue system 400 operates in the back-reflection mode or in the transmission mode depends on the location of the x-ray detector 412 with respect to the fluoride crystal blank 402 and the x-ray generator 410. In the back-reflection mode, which is the mode illustrated in FIG. 4, the x-ray detector 412 is positioned between the x-ray generator 410 and the fluoride crystal blank 402 to record the beams 416 diffracted in a backward direction from the fluoride crystal blank 402. In the transmission mode, the x-ray detector 412 is placed behind the fluoride crystal blank 402 to record beams which are transmitted through the fluoride crystal blank 402. In general, the transmission mode requires the fluoride crystal blank 402 to be thin enough to allow sensing of the diffracted x-ray beams.

Preferably, the x-ray detector 412 can make measurements in real-time. An example of a suitable detector is one included in a real-time Laue camera sold under the trade name MWL110 Real-Time Laue Camera, available from Multiwire Laboratories, Ltd., Ithaca, N.Y. In one embodiment, the x-ray detector 412 is a multi-wire proportional chamber having a two-dimensional array of wires which form an electronic grid 430 disposed inside a gas-tight chamber 432. The gas-tight chamber 432 is connected to a source of quenching gas 434, e.g., a mixture of carbon-dioxide and argon. The quenching gas 434, when present in the gas-tight chamber 432, is ionized by the diffracted beams 416. The ionized quenching gas is sensed by the electronic grid 430, which then sends the sensed information to a signal conditioning module 438 for processing.

In operation, the x-ray generator 410 generates the x-ray beam 414, which passes through the hole 418 and collimator tube 420 to the fluoride crystal blank 402. The x-ray beam 414 may be a polychromatic or a monochromatic x-ray beam. In general, a polychromatic x-ray beam, such as tungsten radiation, is preferred because it would produce diffraction peaks from many more planes of the fluoride crystal blank 414 (improving sensitivity of the system) and would minimize possible fluorescence when the fluoride crystal blank 414 is irradiated. Once the x-ray beam 414 strikes the fluoride crystal blank 402, it is diffracted in many different directions from the planes of the fluoride crystal blank 402. In the reflection mode, the x-ray detector 412 collects the x-ray beams 416 diffracted in the backward direction from the fluoride crystal blank 402.

The diffracted beams 416 ionize the quenching gas inside the gas-tight chamber 432, and the electronic grid 430 senses the ionized quenching gas. For each diffracted beam 416, the electronic grid 430 generates an electrical signal containing information about the spatial position of the diffracted beam 426 and the intensity of the diffracted beam 416. The electrical signals are conditioned in the signal conditioning module 438 and then stored on a computer 440 for further processing. The computer 440 includes algorithms for processing the signal data to generate a Laue pattern for the fluoride crystal blank 402. The Laue pattern (not shown) may be displayed on a screen 442. The image quality of the Laue pattern may be enhanced by signal averaging over a period of time.

Figure 5A:
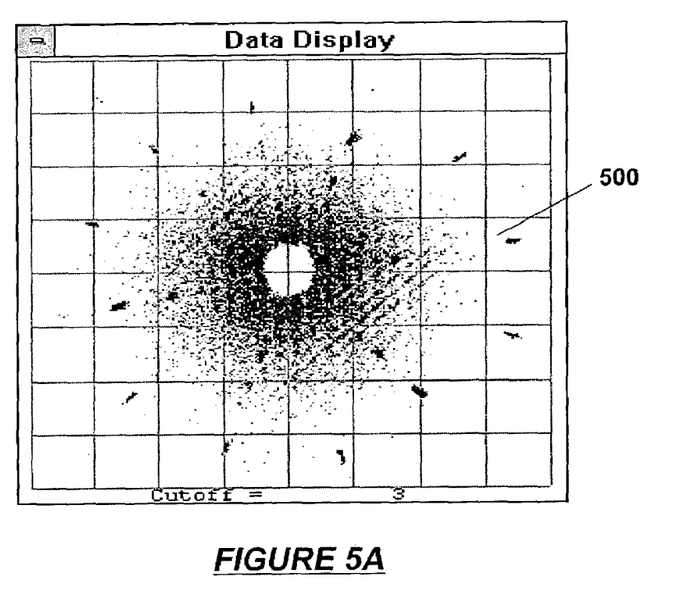
FIG. 5A shows a Laue pattern of a calcium fluoride crystal disc.

In a specific example, which is not to be considered as limiting, the fluoride crystal blank 402 is a calcium fluoride crystal disc with a diameter of 200 mm and a thickness of 30 mm. The calcium fluoride crystal disc is obtained from a calcium fluoride crystal ingot grown by a Bridgman-Stockbarger process, such as previously described. FIG. 5A shows a Laue pattern 500 for the calcium fluoride crystal disc. For example, this Laue pattern could be generated by the computer (440 in FIG. 4) and displayed on the screen (442 in FIG. 4). The Laue pattern 500 includes a series of high-intensity and low-intensity diffraction spots, where each diffraction (or Laue) spot represents a reflecting plane of the calcium fluoride crystal disc. As will be further described below, the orientation of the calcium fluoride crystal disc can be obtained from the Laue pattern 500.

Figure 5B:
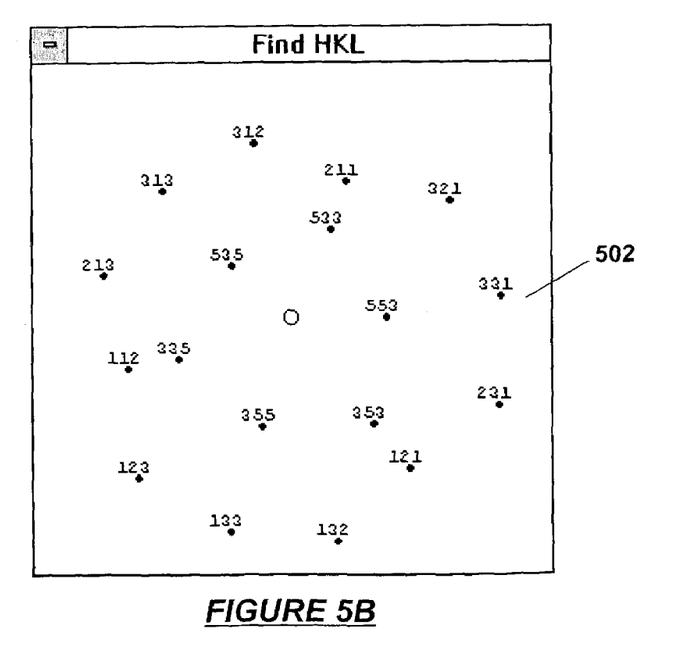
FIG. 5B shows the Miller indices for the Laue pattern shown in FIG. 5A.

There are software programs on the market that can determine the orientation of a crystal from a Laue pattern. One example of a suitable software program is available from Multiwire Laboratories, Ltd., Ithaca, N.Y., under the trade name Northstar. A typical process for determining the orientation of the fluoride crystal blank (402 in FIG. 4) involves selecting two or more spots from the Laue pattern 500. The Miller indices for the selected spots are then determined by looking up a table of Miller indices loaded into computer memory for fluoride cubic crystals. Miller indices, designated by the three letters hkl, are the reciprocals of the reflecting crystal planes within the three main crystal axes. Once the Miller indices of the selected spots are known, the Miller indices of the other spots in the Laue pattern can be calculated. FIG. 5B shows Miller indices 502 for the Laue pattern (500 in FIG. 5A).

Figure 5C:
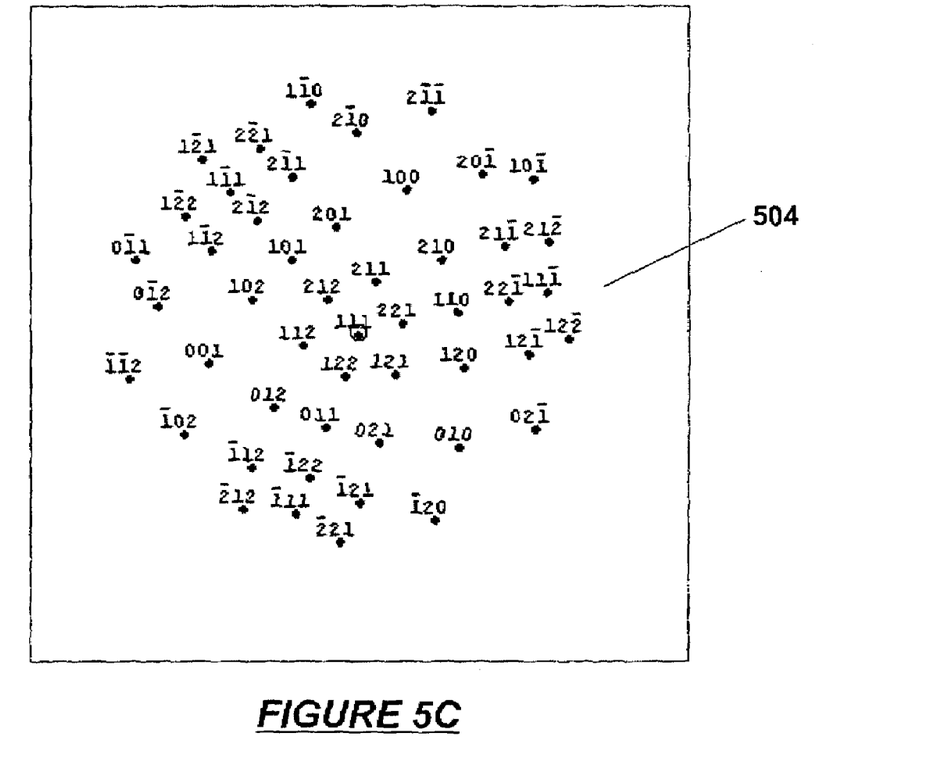
FIG. 5C shows a stereographic projection of the Laue pattern shown in FIG. 5A.

After indexing the Laue pattern, a stereographic projection of the indexed Laue pattern is made. The stereographic projection is used to depict the angular relationships between the reflecting planes of the fluoride crystal blank (402 in FIG. 4). The stereographic projection is made by first plotting the intersection of plane normals with an imaginary sphere. The intersection between the plane normals and the sphere are called the hkl poles. Projection of the hkl poles on a two-dimensional surface is called a stereographic projection. The position of the hkl projection on the equatorial plane (2D projection) of the sphere is determined by the intersection of a line drawn from the hkl pole through the equatorial plane to the lowest/highest point on the opposite of the hemisphere. FIG. 5C shows a stereographic projection 504 for the Laue pattern (500 in FIG. 5A). From the stereographic projection, the angular relationship between the optical axis (408 in FIG. 4) of the fluoride crystal blank (402 in FIG. 4) and the desired crystallographic direction can be determined.

Returning to FIG. 4, before making the Laue measurements, a reference crystal (not shown) having a known crystallographic orientation is mounted on the sample holder 422. The orientation of the sample holder 422 relative to the x-ray beam 414 is then adjusted, using the tilt platform 424, the translation stage 426, and the rotary table 428 until the Laue spot representing the crystal plane normal to the x-ray beam 414 is exactly in the middle of the Laue pattern of the reference crystal. Then, the fluoride crystal blank 402 is mounted in the sample holder 422 in the exact same relationship to the x-ray beam 414 as was the reference crystal. This procedure compensates for any offsets in the sample holder 422 that could affect the Laue measurements. In this way, if the optical axis 408 of the fluoride crystal blank 402 coincides with the desired crystallographic direction, the Laue spot representing the crystal plane 404 normal to the x-ray beam 414 would be exactly in the center of the Laue pattern.

In one example, prior to making the Laue pattern (500 in FIG. 5A), a reference crystal having a [111] crystallographic orientation was used to position the sample holder 422 relative to the x-ray beam 414 such that the Laue spot representing the reference crystal plane normal to the x-ray beam 414 is exactly in the middle of the Laue pattern of the reference crystal. Then, the fluoride crystal blank 402 was mounted in the sample holder 422 in the exact same relationship to the x-ray beam 414 as was the reference crystal. For the example shown in FIG. 5A, the fluoride crystal plane (404 in FIG. 4) is oriented in the desired crystallographic direction. Therefore, the Laue spot representing the crystal plane 404 should be (and is) in the center of the Laue pattern 500. However, the Laue spot representing the crystal plane 404, being exactly in the middle of the Laue pattern 500, is not visible in the Laue pattern 500 because it is reflected back into the collimator tube 420.

Figure 6:
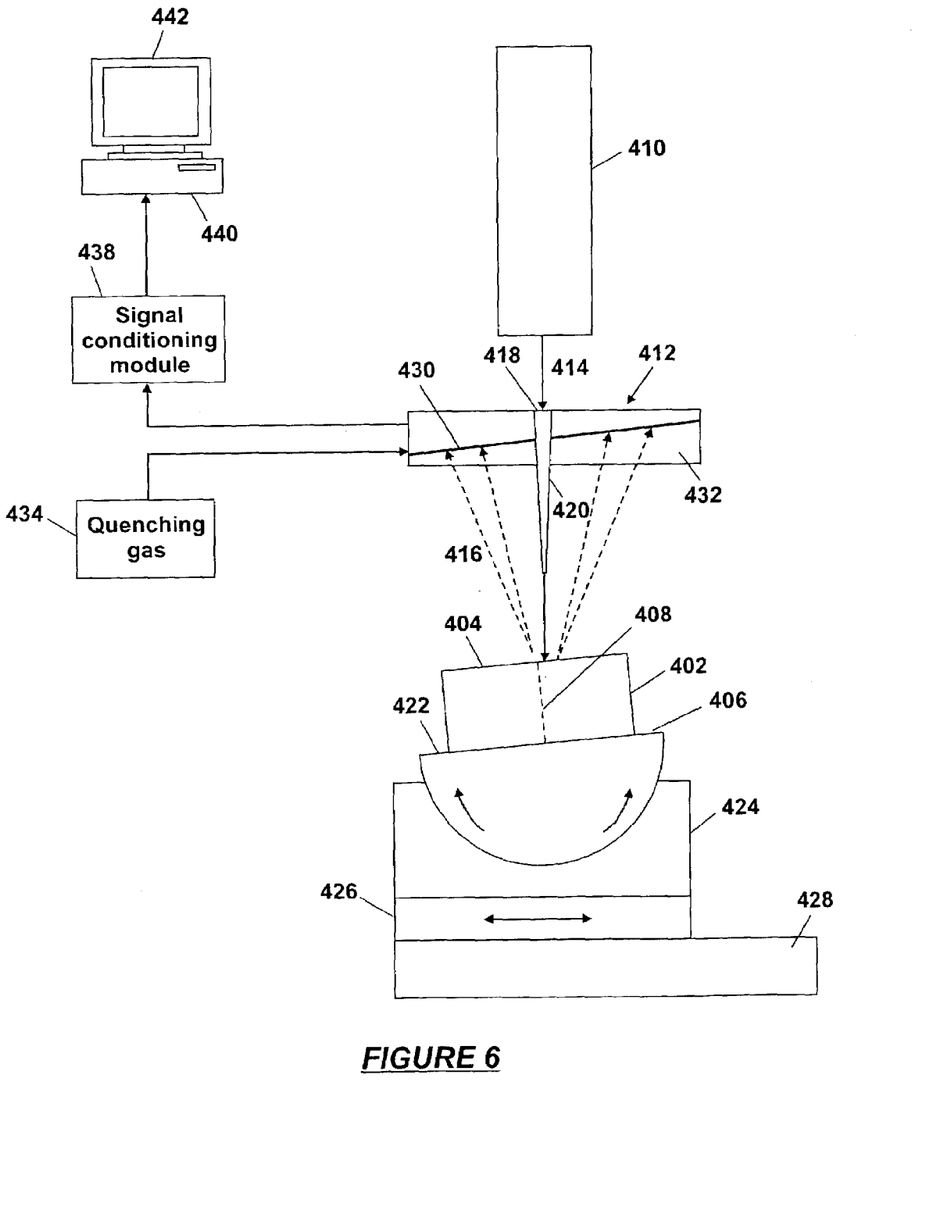
FIG. 6 shows a mis-oriented fluoride crystal blank in the Laue system of FIG. 4.
Figure 7A:
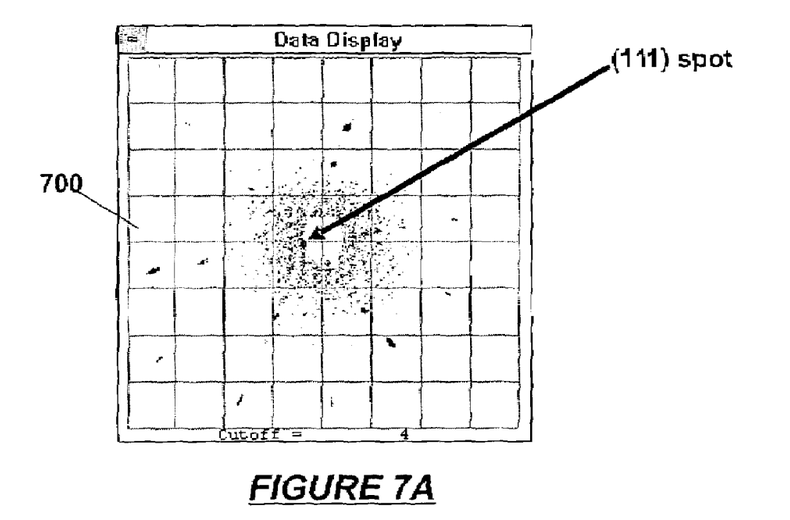
FIG. 7A shows a Laue pattern for a mis-oriented calcium fluoride crystal disc.
Figure 7B:
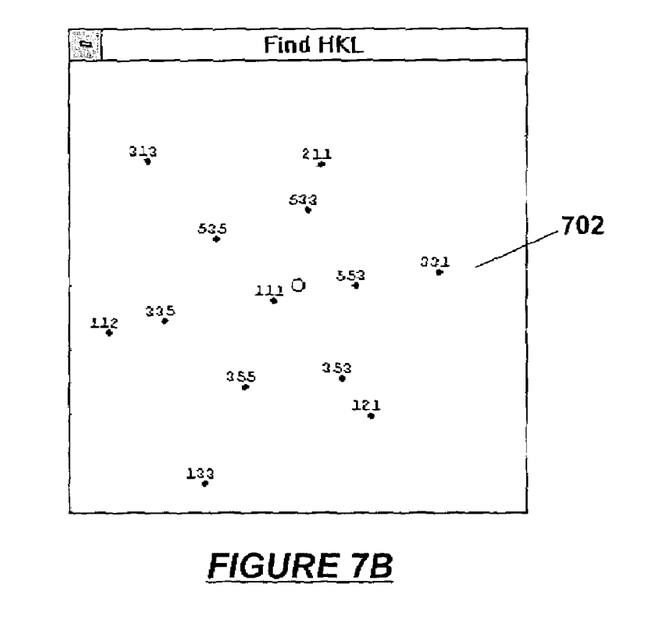
FIG. 7B shows the Miller indices for the Laue pattern shown in FIG. 7A.

To show the effect of mis-orientation of the optical axis of the fluoride crystal blank on the Laue pattern, the fluoride crystal blank was intentionally slightly tilted from its original position, and new Laue measurements were made. FIG. 6 shows the fluoride crystal 402 tilted from its original position so that the crystal plane 404 is no longer normal to the x-ray beam 414. FIG. 7A shows the Laue pattern 700 for the mis-oriented fluoride crystal blank. In this case, the (111) Laue spot is observed at an edge of the central region of the Laue pattern 700. FIG. 7B shows the corresponding hkl indexing 702 of the Laue pattern (700 in FIG. 7B). A stereographic projection (not shown) of the Laue pattern 700 can also be created to show the angular relationships between the crystal planes. For the particular calcium fluoride crystal having the Laue pattern 700, the angular deviation of the optical axis (408 in FIG. 6) from the [111] direction was determined to be 1° in all directions, which is within the typical ±5° specified range for [111] oriented optical lithography calcium fluoride crystal elements.

Figure 8A:
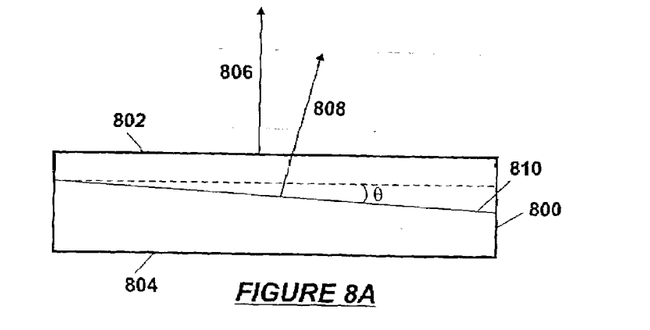
FIG. 8A shows an optical fluoride crystal blank having an optical axis that does not coincide with a desired crystallographic direction.

In cases where the angular deviation of the optical axis of the fluoride crystal blank from the desired crystallographic direction is greater than the acceptable limit, the fluoride crystal blank is modified such that the optical axis of the modified fluoride crystal blank is oriented along the desired crystallographic direction. For illustration purposes, FIG. 8A shows an optical fluoride crystal blank 800 having parallel crystal planes 802, 804 and an optical axis 806 that does not coincide with a desired crystallographic direction 808. A crystal plane 810 having a normal that coincides with the desired crystallographic direction 808 is also shown in FIG. 8A. Because the optical axis 806 of the fluoride crystal blank 800 does not coincide with the desired crystallographic direction 808, the crystal planes 802, 804 are not parallel to the crystal plane 810. The angular deviation, θ, of the optical axis 806 from the desired crystallographic direction 808 can be determined from the Laue pattern (not shown) of the fluoride crystal blank 800.

Figure 8B:
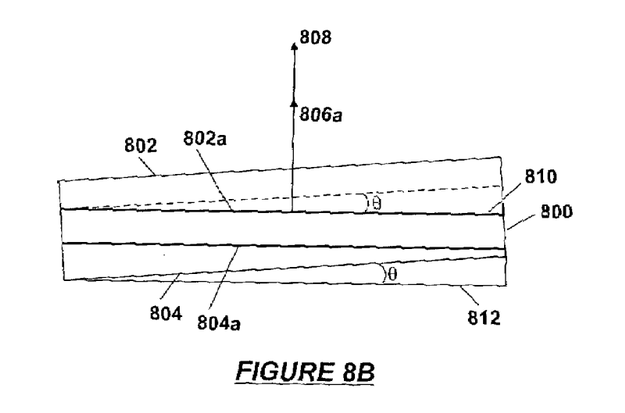
FIG. 8B illustrates a process for modifying the fluoride crystal blank such that the optical axis of the fluoride crystal blank becomes oriented along the desired crystallographic direction.
Figure 8C:
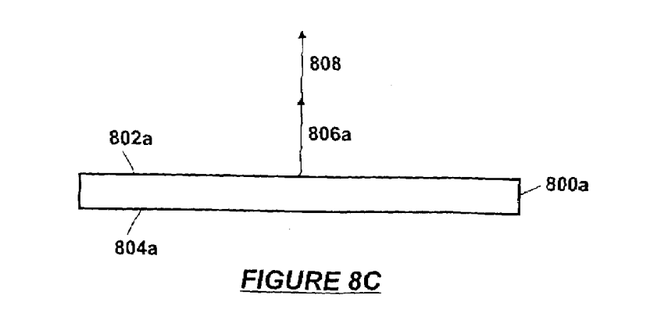
FIG. 8C shows a fluoride crystal blank having the desired crystallographic orientation.

FIG. 8B illustrates a process for modifying the fluoride crystal blank 800 such that the optical axis 806 of the fluoride crystal blank 800 becomes oriented along the desired crystallographic direction 808. The process involves orienting the fluoride crystal blank 800 at an angle θ with respect to a flat (reference) surface 812. A machining process, e.g., grinding, laser ablation, etc., is then used to remove material from the fluoride crystal blank 800 to form crystal planes 802a, 804a, which are parallel to the flat surface 812. FIG. 8C shows the modified fluoride crystal blank, now indicated by the reference numeral 800a. The normal 806a to the crystal planes 802a, 804a, i.e., the optical axis of the modified fluoride crystal blank 800a, is now oriented along the desired crystallographic direction 808.

Figure 9A:
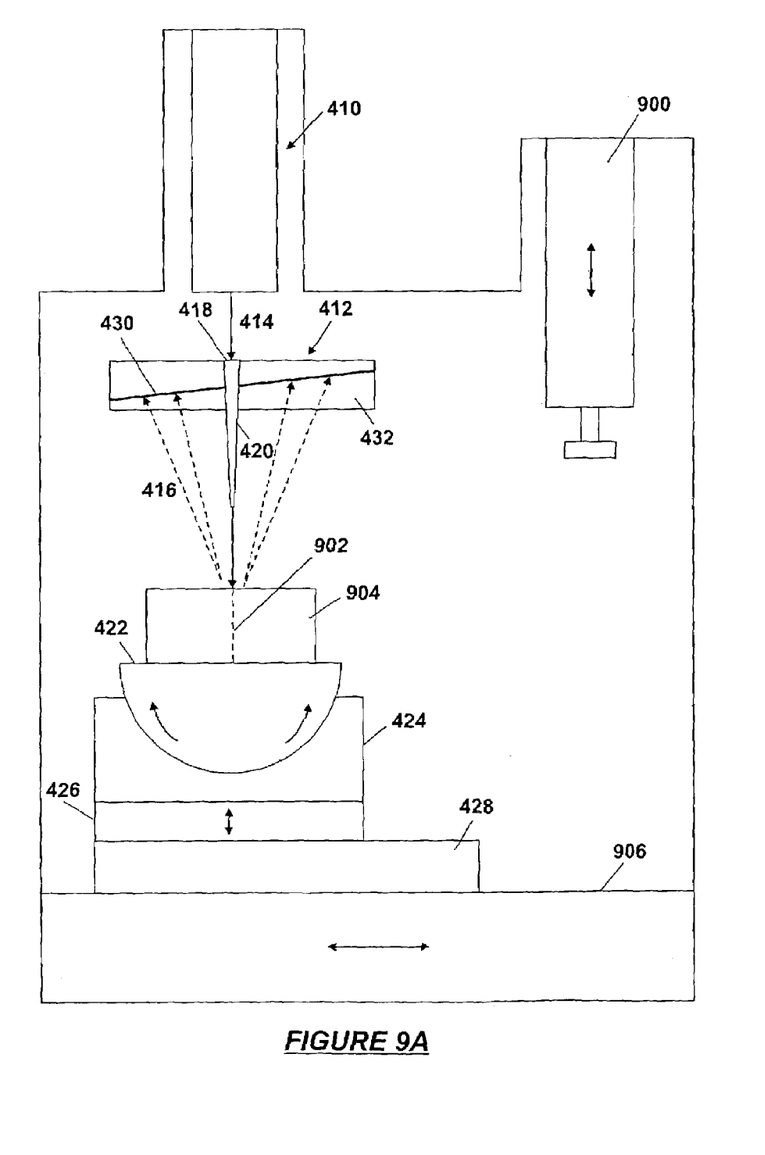
FIG. 9A shows the Laue system of FIG. 4 integrated with a machining tool.
Figure 9B:
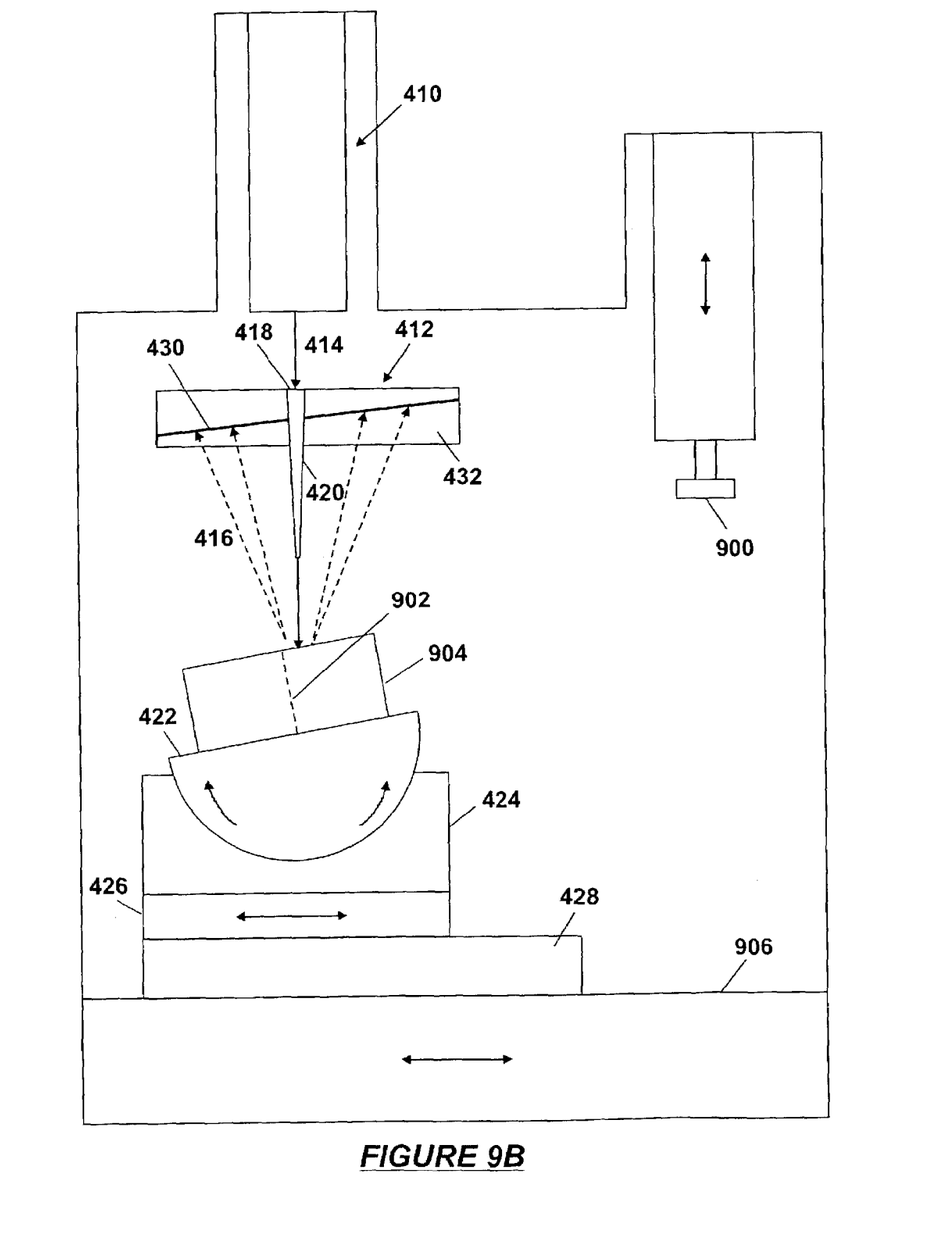
FIG. 9B shows a crystal blank re-oriented based on information gathered from Laue measurements.
Figure 9C:
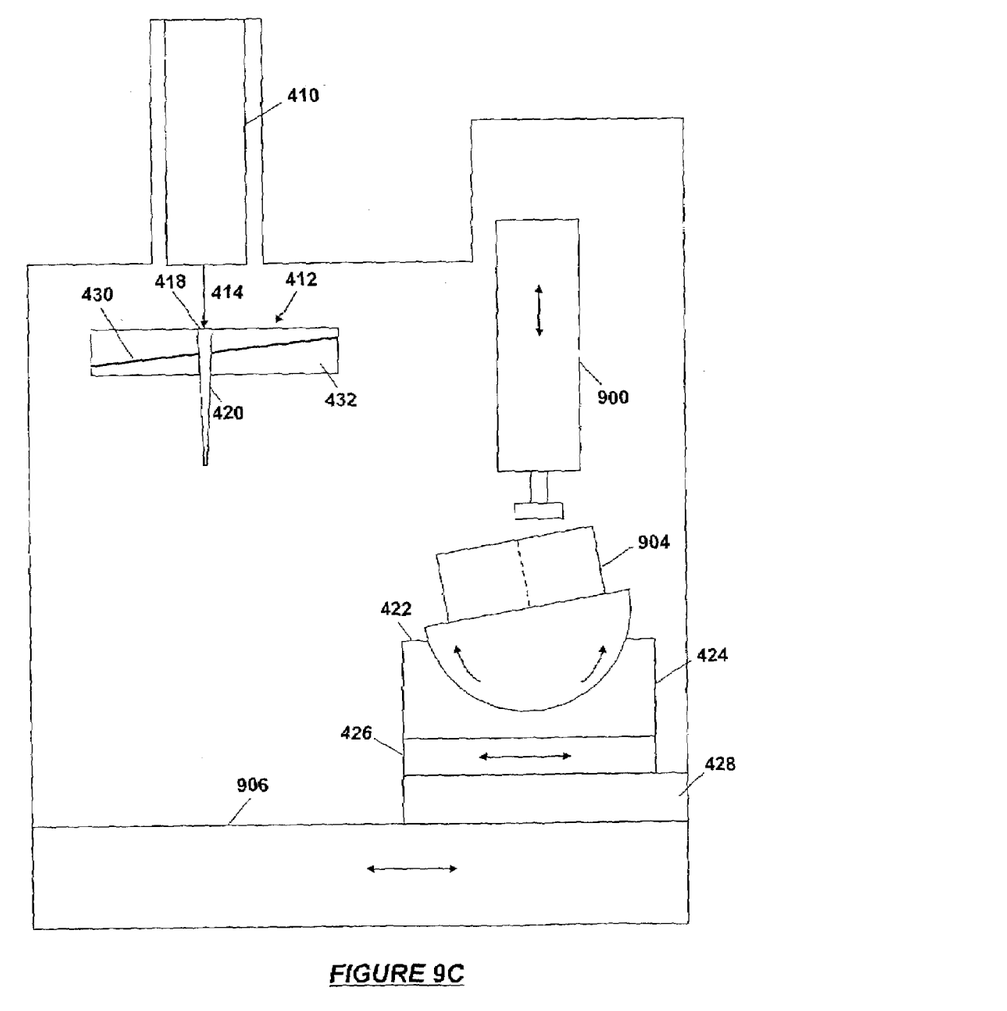
FIG. 9C shows the re-oriented crystal blank translated to the machining tool.
Figure 9D:
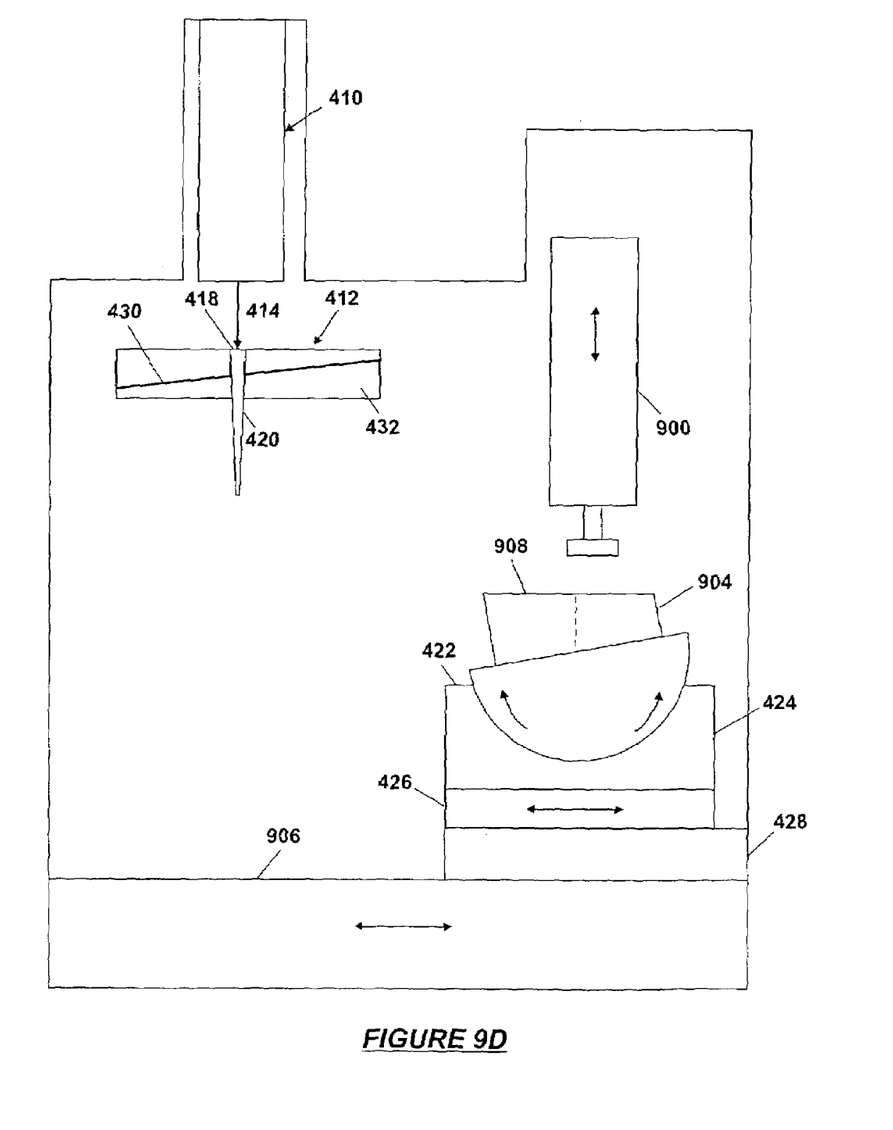
FIG. 9D shows the crystal blank of FIG. 9B after machining with the machining tool.

In one embodiment, as illustrated in FIG. 9A, the Laue system 400 is integrated with a machining tool 900, such as a manual or CNC machine, allowing mis-orientation information to be easily transmitted to the machining tool 900. Assume, for example, that the optical axis 902 of a fluoride crystal blank 904, mounted on the sample holder 422, is not aligned with the desired crystallographic direction, as determined from the Laue measurements, and that the angle of deviation of the optical axis 902 from the desired crystallographic direction has been determined as described above. Further, assume that the tilt platform 424 has been controlled to adjust the orientation of the fluoride crystal blank 902 by an amount proportional to the angular deviation, as shown in FIG. 9B. In this new position, the fluoride crystal blank 902 can be translated directly to the machining tool 900 via an x-y translation stage 906, as shown in FIG. 9C. The machining tool 900 can then be controlled to remove material from the fluoride crystal blank 902, as shown in FIG. 9D, such that a flat surface 908 having the desired crystallographic orientation is formed. The fluoride crystal blank 902 can then be flipped over and machined by the machining tool 900 to form another flat surface that is parallel to the flat surface 908. If desired, the modified fluoride crystal blank 902 can be translated back to the Laue system 400, and the Laue measurements can be repeated to ensure that the desired crystallographic orientation has been achieved.

The real time Laue method is rapid and well suited for both laboratory and production applications. In the production environment, the Laue system is preferably integrated into a machining tool as discussed above to allow mis-orientation information to be transmitted to the machining tool in real-time. Preferably, the sample holder 422 is large enough, e.g., at least 10 cm in diameter, to receive optical crystals having diameters of 20 cm or larger. The sample holder 422 may also receive optical crystals having diameters smaller than 20 cm. Therefore, the invention is not limited to optical crystals having diameters of 20 cm or larger. In the practice of the invention, the distance from the sample holder 422 to the x-ray detector 412 can be changed for each Laue measurement to allow for multiple observed orientation measurements, which can be used to filter out any noise in the system. Preferably, the tilt platform 424, translation stage 426, and the rotary table 428 are shut down and shielded after each move so that the real-time Laue pattern generated and detected is of high quality and that the electronic components such as the stage motor and related electronics do not interfere with the x-ray detector by generating EMF noise.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for making an oriented fluoride crystal blank for transmitting below 250 nm ultraviolet light, comprising:
   a Laue system comprising a sample holder for holding the fluoride crystal blank, an x-ray generator for generating an x-ray beam to strike the fluoride crystal blank at normal incidence, and an x-ray detector for detecting x-ray beams diffracted from the fluoride crystal blank;
   a machining tool for forming a flat surface on the fluoride crystal blank based on orientation information deduced from the diffracted x-ray beams; and
   means for translating the sample holder between the Laue system and the machining tool.

2. The apparatus of claim 1, wherein the x-ray detector comprises an electronic wire grid disposed in a gas-tight chamber.

3. The apparatus of claim 2, further comprising means for supplying a quenching gas into the gas-tight chamber.

4. The apparatus of claim 1, wherein the x-ray generator generates a polychromatic x-ray beam.

5. The apparatus of claim 1, further comprising means for tilting and rotating the sample holder relative to the x-ray generator.

6. The apparatus of claim 1, further comprising means for translating the sample holder relative to the x-ray detector.

7. The apparatus of claim 1, wherein the x-ray detector is positioned between the sample holder and the x-ray generator.

8. The apparatus of claim 1, wherein the sample holder is positioned between the x-ray detector and the x-ray generator.

9. The apparatus of claim 1, further comprising means for deducing an orientation of the optical axis of the fluoride crystal blank with respect to a specific crystallographic direction from a diffraction pattern formed by the diffracted x-ray beams.

* * * * *